US011669671B2

(12) United States Patent
Biswas et al.

(10) Patent No.: US 11,669,671 B2
(45) Date of Patent: *Jun. 6, 2023

(54) SEMICONDUCTOR DEVICE INCLUDING PG-ALIGNED CELLS AND METHOD OF GENERATING LAYOUT OF SAME

(71) Applicant: TAIWAN SEMICONDUCTOR MANUFACTURING COMPANY, LTD., Hsinchu (TW)

(72) Inventors: Hiranmay Biswas, Hsinchu (TW); Chung-Hsing Wang, Hsinchu (TW); Kuo-Nan Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 94 days.

This patent is subject to a terminal disclaimer.

(21) Appl. No.: 17/131,169

(22) Filed: Dec. 22, 2020

(65) Prior Publication Data

US 2021/0110098 A1    Apr. 15, 2021

Related U.S. Application Data

(63) Continuation of application No. 16/045,310, filed on Jul. 25, 2018, now Pat. No. 10,878,163.

(Continued)

(51) Int. Cl.
*G06F 30/39*     (2020.01)
*H01L 23/528*    (2006.01)
(Continued)

(52) U.S. Cl.
CPC .......... *G06F 30/398* (2020.01); *G06F 30/36* (2020.01); *G06F 30/39* (2020.01);
(Continued)

(58) Field of Classification Search
CPC ........ G06F 30/398; G06F 30/36; G06F 30/39; G06F 30/392; H01L 27/0207;
(Continued)

(56) References Cited

U.S. PATENT DOCUMENTS 5,668,389 A * 9/1997 Jassowski ........... H01L 23/5286
                                              257/691
6,308,307 B1 * 10/2001 Cano .................... G06F 30/394
                                              716/120
(Continued)

OTHER PUBLICATIONS

Shailesh Kumar et al., "Latch-up Improvement for TapLess Library Through Modified Decoupling Capacitors Cells", https://www.design-reuse.com, Jun. 12, 2018; total 9 pages.

*Primary Examiner* — Nghia M Doan
(74) *Attorney, Agent, or Firm* — Hauptman Ham, LLP

(57) ABSTRACT

A semiconductor structure includes a power grid layer (including a first metallization layer) and a set of cells. The first metallization layer includes: conductive first and second portions which provide correspondingly a power-supply voltage and a reference voltage, and which have corresponding long axes oriented substantially parallel to a first direction; and conductive third and fourth portions which provide correspondingly the power-supply voltage and the reference voltage, and which have corresponding long axes oriented substantially parallel to a second direction substantially perpendicular to the first direction. The set of cells is located below the PG layer. Each cell is monostate cell which lacks an input signal and has a single output state. The cells are arranged to overlap at least one of the first and second portions in a repeating relationship with respect to at least one of the first or second portions of the first metallization layer.

20 Claims, 12 Drawing Sheets

Related U.S. Application Data

(60) Provisional application No. 62/552,203, filed on Aug. 30, 2017.

(51) Int. Cl.
*G06F 30/398* (2020.01)
*H01L 27/02* (2006.01)
*H01L 27/118* (2006.01)
*G06F 30/36* (2020.01)

(52) U.S. Cl.
CPC .... *H01L 27/0207* (2013.01); *H01L 27/11807* (2013.01); *H01L 2027/11875* (2013.01); *H01L 2027/11881* (2013.01)

(58) Field of Classification Search
CPC ..... H01L 27/11807; H01L 2027/11875; H01L 2027/11881; H01L 23/5223; H01L 23/5286
See application file for complete search history.

(56) References Cited

U.S. PATENT DOCUMENTS

| | | | |
|---|---|---|---|
| 6,421,819 | B1 | 7/2002 | Masukawa |
| 6,467,074 | B1 | 10/2002 | Katsioulas et al. |
| 6,823,499 | B1 * | 11/2004 | Vasishta .................. G06F 30/39 716/120 |
| 7,115,460 | B2 | 10/2006 | Shaw et al. |
| 9,082,886 | B2 | 7/2015 | Chen et al. |
| 10,878,163 | B2 * | 12/2020 | Biswas ............. H01L 27/11807 |
| 2007/0228419 | A1 | 10/2007 | Komaki |
| 2014/0264924 | A1 * | 9/2014 | Yu ....................... H01L 27/0207 438/622 |
| 2017/0194319 | A1 | 7/2017 | Xu et al. |
| 2017/0294448 | A1 * | 10/2017 | Debacker .......... H01L 27/11807 |
| 2018/0166386 | A1 * | 6/2018 | Biswas ............... H01L 23/5286 |
| 2018/0269154 | A1 | 9/2018 | Kishishita |
| 2018/0350791 | A1 | 12/2018 | Do et al. |

* cited by examiner

SEMICONDUCTOR DEVICE INCLUDING PG-ALIGNED CELLS AND METHOD OF GENERATING LAYOUT OF SAME

PRIORITY CLAIM

The present application is a continuataion application of U.S. application Ser. No. 16/045,310, filed Jul. 25, 2018, now U.S. Pat. No. 10,878,163, issued on Dec. 29, 2020, which claims the benefit of Provisional Application No. 62/552,203, filed Aug. 30, 2017, which are incorporated herein by reference in their corresponding entireties.

BACKGROUND

One way in which to represent a semiconductor device is with a plan view diagram referred to as a layout-diagram. During placement stage of layout-diagram generation, rows in the layout-diagram are populated with standard functional cells from a library of various standard cell configurations. Depending on the design, number of layers, or the like, the area-utilization in terms of standard functional cells is limited, e.g., to about 80% or less, in order to leave space for signal routing. If area utilization by functional standard cells exceeds about 80%, routability is significantly diminished, the noise profile deteriorates significantly resulting in timing failures, or the like.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
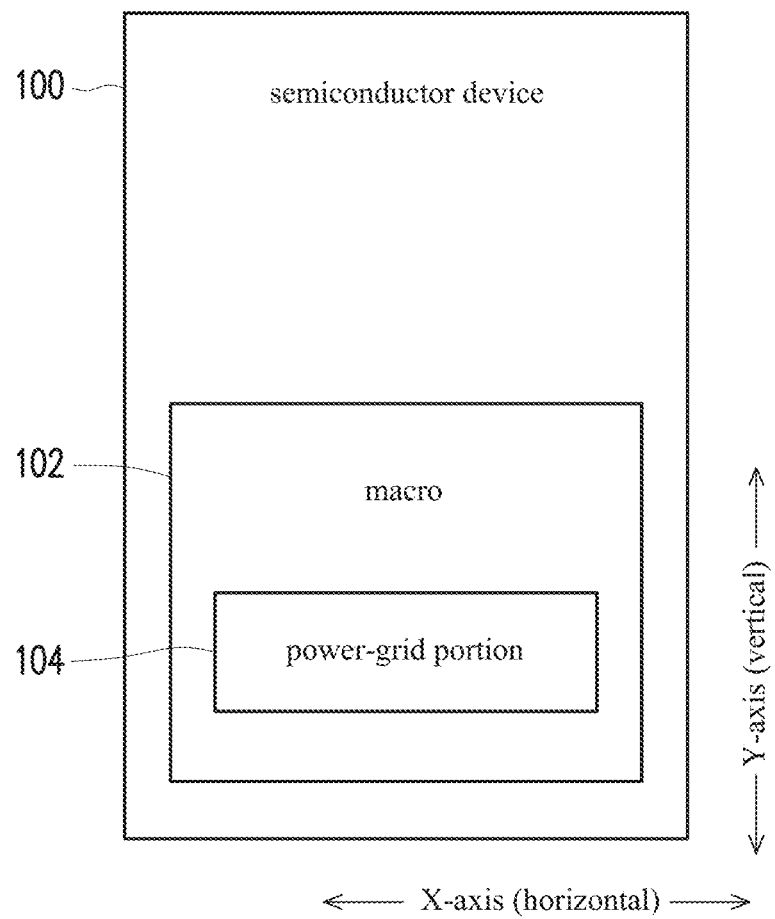
FIG. 1 is a block diagram of a semiconductor device, in accordance with at least one embodiment of the present disclosure.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The phrases "substantially rectangular," "substantially parallel," "substantially perpendicular," and "substantially aligned," and the like should be understood in the context of variations which result from manufacturing process-tolerances.

According to another approach, during placement stage of layout-diagram generation and after placement of the functional cells, areas not occupied by functional cells are populated with filler cells in order to preserve electrical continuity of cell-spanning power rails and/or ground rails, promote more uniform planarity, ensure compliance with a conductor-density minimum required by a design rule, preserve continuity of dopant-wells, preserve continuity of dopant layers, or the like. If, after the placement stage and by happenstance, a region below one or more metallization segments in a power-grid was not occupied by functional cells, then such a region was populated with a filler cell. There was no repeating relationship between regions below metallization segments in a power-grid and the filler cells which populated such regions.

According to some embodiments, a semiconductor structure includes: a power-grid (PG) layer including: a first metallization layer including: first portions and second portions which: are conductive; are configured to provide correspondingly a power-supply voltage and a reference voltage; and have corresponding long axes oriented substantially parallel to a first direction; and corresponding ones of the first portions of the first metallization layer being arranged in first pairs; corresponding ones of the second portions of the first metallization layer being arranged in second pairs; a second metallization layer over the first metallization layer, the second metallization layer including: third portions and fourth portions which: are conductive; are configured to provide correspondingly the power-supply voltage and the reference voltage; and have corresponding long axes oriented substantially parallel to a second direction substantially perpendicular to the first direction; and a set of cells, wherein the set of cells is located below the PG layer; each cell is a monostate cell which lacks an input signal and has a single output state; the cells being arranged to overlap at least one of the first and second portions of the first metallization layer relative to the first direction; and the cells being arranged in a repeating relationship that each cell overlaps, relative to the first direction and the second direction, an intersection of (A) a corresponding one of the first or second pairs with (B) at least a corresponding one of the third portions or a corresponding one of the fourth portions. In some embodiments, the cells include tap cells.

FIG. 1 is a block diagram of a semiconductor device 100, in accordance with at least one embodiment of the present disclosure.

In FIG. 1, semiconductor device 100 includes, among other things, a macro 102. In some embodiments, a circuit macro 102 is an SRAM memory system which includes (among other things) a semiconductor structure (hereinafter, a power-grid portion) 104 (see item 200 of FIG. 2, 300 of FIG. 3, discussed below, or the like). In some embodiments, circuit macro/module 102 is understood in the context of an analogy to the architectural hierarchy of modular programming in which subroutines/procedures are called by a main program (or by other subroutines) to carry out a given computational function. In this context, semiconductor device 100 uses circuit macro/module 102 to perform one or more given functions. Accordingly, in this context and in terms of architectural hierarchy, semiconductor device 100 is analogous to the main program and circuit macro/module (hereinafter, macro) 102 is analogous to subroutines/procedures. In some embodiments, macro 102 is a soft macro. In some embodiments, macro 102 is a hard macro. In some embodiments, macro 102 is a soft macro which is described/couched in register-transfer level (RTL) code. In some embodiments, synthesis, placement and routing have yet to have been performed on macro 102 such that the soft macro can be synthesized, placed and routed for a variety of process nodes. In some embodiments, macro 102 is a hard macro which is described/couched in a binary file format (e.g., Graphic Database System II (GDSII) stream format), where the binary file format represents planar geometric shapes, text labels, other information and the like of one or more layout-diagrams of macro 102 in hierarchical form. In some embodiments, synthesis, placement and routing have been performed on macro 102 such that the hard macro is specific to a particular process node.

Figure 2:
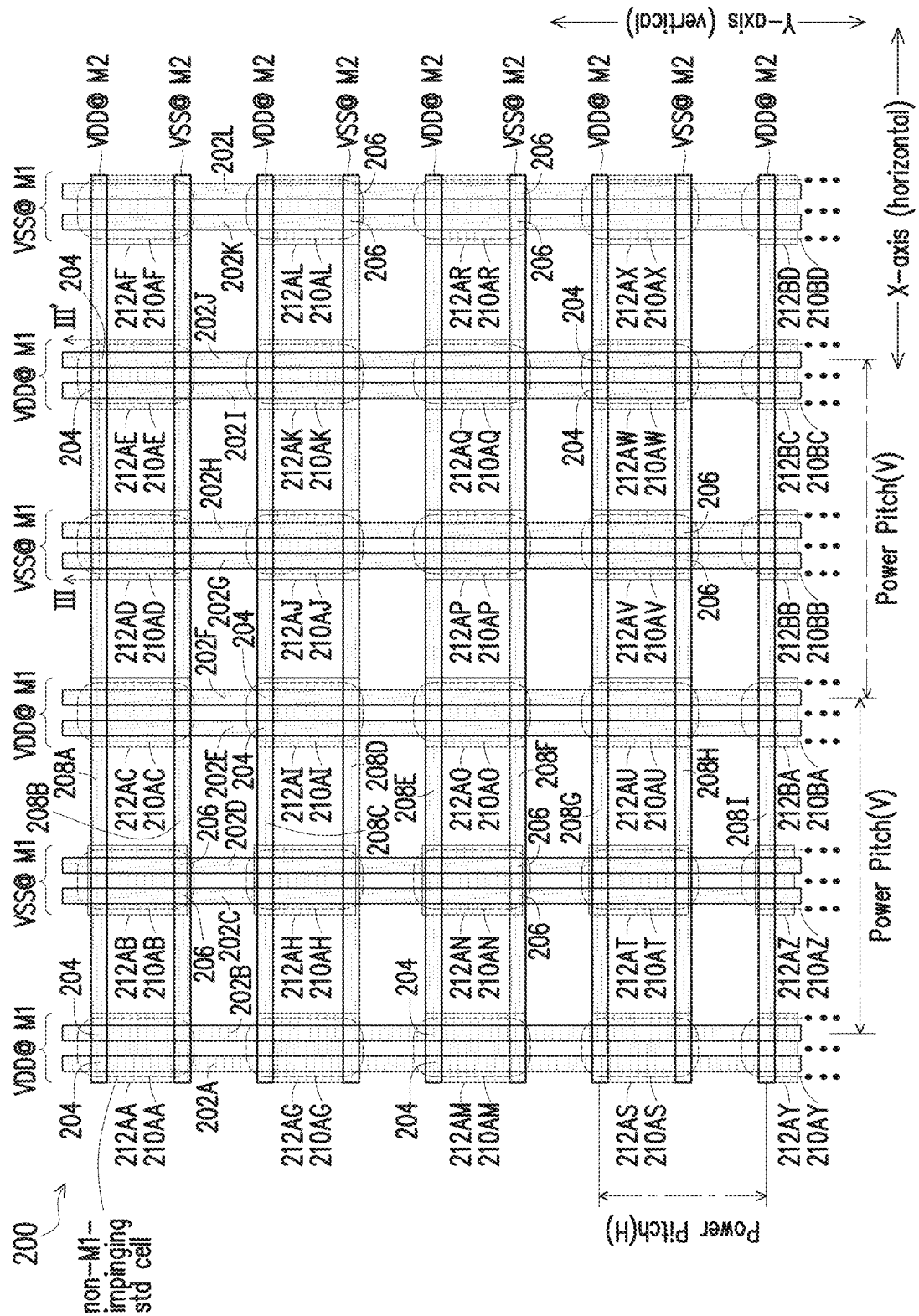
FIG. 2 is a layout-diagram of a power-grid portion of a circuit macro, in accordance with at least one embodiment of the present disclosure.

FIG. 2 is a layout-diagram 200 of a power-grid portion of a circuit macro, in accordance with at least one embodiment of the present disclosure. In some embodiments, a power-grid portion produced from layout-diagram 200 is power-grid portion 104 of macro 102 of FIG. 1. In some embodiments, a power-grid portion produced from layout-diagram 200 is a power-grid portion 300 of FIG. 3 (discussed below).

In FIG. 2, layout-diagram 200 includes a power-grid (PG) set of patterns representing a PG layer (330 FIG. 3, discussed below). The PG set of patterns includes a first subset of patterns; via patterns 204 representing a via layer (334 FIG. 3, discussed below); and a second subset of patterns.

The first subset of patterns includes: first conductor-patterns 202A, 202B, 202E, 202F, 202I and 202J representing corresponding conductive first portions of a first metallization layer (e.g., 332 FIG. 3) which provide a power-supply voltage; and second conductor-patterns 202C, 202D, 202G, 202H, 202K and 202L representing corresponding conductive second portions of the first metallization layer which provide a reference voltage. Long axes of first conductor-patterns 202A, 202B, 202E, 202F, 202I and 202J and second conductor-patterns 202C, 202D, 202G, 202H, 202K and 202L are oriented parallel to a first direction.

The second subset of patterns includes: third conductor-patterns 208A, 208C, 208E, 208G and 208I representing conductive third portions of a second metallization layer (e.g., 336 FIG. 3) which provide the power-supply voltage; and fourth conductor-patterns 208B, 208D, 208F and 208H representing conductive fourth portions of the second metallization layer which provide the reference voltage. Long axes of third conductor-patterns 208A, 208C, 208E, 208G and 208I and fourth conductor-patterns 208B, 208D, 208F and 208H are oriented parallel to a second direction which is substantially perpendicular to the first direction.

In FIG. 2, the first direction is the vertical direction and the second direction is the horizontal direction. In some embodiments, the first and second directions are directions other than the corresponding vertical and horizontal directions.

In FIG. 2, the power-supply voltage is VDD. In some embodiments, the power-supply voltage is a voltage other than VDD. In some embodiments, the reference voltage is VSS. In some embodiments, the reference voltage is VSS. In some embodiments, the reference voltage is ground. In some embodiments, the reference voltage is a voltage other than VSS.

In FIG. 2, the first metallization layer is M1 and the second metallization layer is M2. In some embodiments, the first metallization layer is M0 and the second metallization layer is M1. In some embodiments, the first metallization layer is M(i) and the second metallization layer is M(i+1), where i is an integer and i>1.

Via patterns 204 represent conductive interconnection structures commonly referred to as vias. Via patterns 204 are inserted between first conductor-patterns 202A, 202B, 202E, 202F, 202I and 202J and corresponding third conductor-patterns 208A, 208C, 208E, 208G and 208I. Via patterns 204 are also inserted between second conductor-patterns 202C, 202D, 202G, 202H, 202K and 202L and corresponding fourth conductor-patterns 208B, 208D, 208F and 208H.

In FIG. 2, PG intersections 210AA-210AZ and 210BA-210BD (hereinafter 210AA-210BD) are shown on layout-diagram 200. In FIG. 2, intersections 210AY-210AZ and 21BA-210BD are truncated, as indicated by ellipses. Intersections 210AA, 210AB, 210AG and 210AH are discussed in more detail as examples. Intersection 210AA is substantially centered between corresponding segments of first conductor-patterns 202A and 202B, and is substantially centered between corresponding segments of third conductor-pattern 208A and fourth conductor-patterns 208B. Intersection 210AB is substantially centered between corresponding segments of second conductor-patterns 202C and 202D, and is substantially centered between corresponding segments of third conductor-pattern 208A and fourth conductor-patterns 208B. Intersection 210AG is substantially centered between corresponding segments of first conductor-patterns 202A and 202B, and is substantially centered between corresponding segments of third conductor-pattern 208C and fourth conductor-patterns 208D. Intersection 210AB is substantially centered between corresponding segments of second conductor-patterns 202C and 202D, and is substantially centered between corresponding segments of third conductor-pattern 208C and fourth conductor-patterns 208D.

Layout-diagram 200 further includes cell-patterns 212AA-212AZ and 212BA-212BD (hereinafter, 212AA-212BD) which represent standard cells. In FIG. 2, cell-patterns 212AY-212AZ and 212BA-212BD are truncated, as indicated by ellipses. Each of cell-patterns 212AA-212BD represents a standard cell that excludes an M1-conductor-pattern representing a conductive structure included in the first metallization layer (which, again, is M1 in FIG. 2). Such standard cells are described as non-M1-impinging standard cells. Accordingly, cell-patterns 212AA-212BD are described as non-M1-impinging cell-patterns.

In FIG. 2, cell-patterns 212AA-212BD are located below the M1 layer.

In FIG. 2, each of cell-patterns 212AA-212BDD is substantially centered on corresponding intersections 210AA-210BD. In some embodiments, each of cell-patterns 212AA-212BDD is not substantially centered on corresponding intersections 210AA-210BD.

In FIG. 2, each of cell-patterns 212AA-212BDD overlaps corresponding intersection 210AA-210BD symmetrically with respect to the first direction. In some embodiments, each of cell-patterns 212AA-212BDD overlaps corresponding intersection 210AA-210BD asymmetrically with respect to the first direction.

In FIG. 2, each of cell-patterns 212AA-212BDD overlaps corresponding intersection 210AA-210BD symmetrically with respect to the second direction. In some embodiments, each of cell-patterns 212AA-212BDD overlaps corresponding intersection 210AA-210BD asymmetrically with respect to the second direction.

The substantial centering of cell-patterns 212AA-212BDD on corresponding intersections 210AA-210BD is: an example of cell-patterns 212AA-212BD being arranged in a repeating relationship with respect to corresponding intersections 210AA-210BD; therefore an example of cell-patterns 212AA-212BD being arranged in a repeating relationship with respect to corresponding segments of first conductor-patterns 202A, 202B, 202E, 202F, 202I and 202J and second conductor-patterns 202C, 202D, 202G, 202H, 202K and 202L; and therefore also an example of cell-patterns 212AA-212BD being arranged in a repeating relationship with respect to corresponding segments of third conductor-patterns 208A, 208C, 208E, 208G and 208I and fourth conductor-patterns 208B, 208D, 208F and 208H.

In some embodiments, fewer than all of intersections 210AA-210BD are provided with corresponding fewer instances of the non-M1-impinging cell-patterns albeit while maintaining a repeating relationship of the fewer instances of the non-M1-impinging cell-patterns and with respect to the fewer than all intersections 210AA-210BD. In some embodiments, intersections 210AC, 210AI, 210AO, 210AU and 210BA are provided with corresponding cell-patterns 212AC, 212AI, 212AO, 212AU and 212BA while other ones of intersections 210AA-210BD are not provided with corresponding instances of the non-M1-impinging cell-patterns.

Recalling that intersections 210AB, 210AD, 210AF, 210AH, 210AJ, 210AL, 210AN, 210AP, 210AR, 210AT, 210AV, 210AX, 210AZ, 210BB and 210BD correspond to segments of second conductor-patterns 202C, 202D, 202G, 202H, 202K and 202L which represents conductor segments having the reference voltage VSS, in some embodiments, intersections 210AB, 210AD, 210AF, 210AH, 210AJ, 210AL, 210AN, 210AP, 210AR, 210AT, 210AV, 210AX, 210AZ, 210BB and 210BD are provided with corresponding cell-patterns 212AB, 212AD, 212AF, 212AH, 212AJ, 212AL, 212AN, 212AP, 212AR, 212AT, 212AV, 212AX, 212AZ, 212BB and 212BD while other ones of intersections 210AA-210BD are not provided with corresponding instances of the non-M1-impinging cell-patterns.

Recalling that intersections 210AA, 210AC, 210AE, 210AG, 210AI, 210AK, 210AM, 210AO, 210AQ, 210AS, 210AU, 210AW, 210AY, 210BA and 210BC correspond to segments of first conductor-patterns 202A, 202B, 202E, 202F, 202I and 202J which represents conductor segments having the reference voltage VDD, in some embodiments, intersections 212AA, 212AC, 212AE, 212AG, 212AI, 212AK, 212AM, 212AO, 212AQ, 212AS, 212AU, 212AW, 212AY, 212BA and 212BC are provided with corresponding cell-patterns 212AB, 212AD, 212AF, 212AH, 212AJ, 212AL, 212AN, 212AP, 212AR, 212AT, 212AV, 212AX, 212AZ, 212BB and 212BD while other ones of intersections 210AA-210BD are not provided with corresponding instances of the non-M1-impinging cell-patterns.

In some embodiments, first conductor-patterns 202A, 202B, 202E, 202F, 202I and 202J and second conductor-patterns 202C, 202D, 202G, 202H, 202K and 202L are extended in the first direction beyond what is shown in FIG. 2 and additional corresponding instances of the third conductor-patterns, the fourth conductor-patterns and via-patterns 204 are provided resulting in additional corresponding first instances of the PG intersections. In such embodiments, one or more additional instances the non-M1-impinging cell-pattern are provided correspondingly at one or more of the additional first instances of the PG intersections.

In some embodiments, third conductor-patterns 208A, 208C, 208E, 208G and 208I and fourth conductor-patterns 208B, 208D, 208F and 208H are extended in the second direction beyond what is shown in FIG. 2 and additional corresponding instances of the first conductor-patterns, the second conductor-patterns and via-patterns 204 are provided resulting in additional corresponding instances of the PG intersections. In such embodiments, one or more additional second instances the non-M1-impinging cell-pattern are provided correspondingly at one or more of the additional second instances of the PG intersections.

In some embodiments, each of cell-patterns 210A-210Z and 212A is not: substantially centered between corresponding segments of first conductor-patterns 202A, 202B, 202E, 202F, 202I and 202J and second conductor-patterns 202C, 202D, 202G, 202H, 202K and 202L; and/nor substantially centered between corresponding segments of third conductor-patterns 208A, 208C, 208E, 208G and 208I and fourth conductor-patterns 208B, 208D, 208F and 208H.

In some embodiments, one or more of cell-patterns 212AA-212BD represent corresponding standard tap cells. In some embodiments, each of cell-patterns 212AA-212BD represents a standard tap cell. In some embodiments, where (A) a subset of intersections, representing fewer than all of intersections 210AA-210BD, are provided with corresponding instances of the non-M1-impinging cell-patterns and (B) each of corresponding instances of the non-M1-impinging cell-patterns are standard cells, the corresponding instances of the standard cells are not necessarily provided in a repeating relationship with respect to the subset of intersections.

In some embodiments, a standard tap cell provides a transistor body bias for one or more transistors. In some embodiments, a standard tap cell supplies a body bias by supplying power to the well on which a CMOS device is formed. In some embodiments, a standard tap cell provides a bias voltage to a corresponding N-well and/or a bias voltage to a corresponding P-well. In some embodiments, a standard tap cell couples an N-well to a first power rail, e.g., a VDD rail, and/or couples a P-well to a second power rail, e.g., a VSS rail. In some embodiments, benefits of a standard tap cell include one or more of reducing susceptibility to circuit latch-up, reducing FET transistor leakage current, adjusting FET transistor threshold voltage, or the like. In some embodiments in which standard tap cells are interspersed with standard cells (the latter not being standard tap cells) in a given area, if the number of standard tap cells satisfies a threshold density, then a need is eliminated otherwise to include body biasing features in the other standard cells, wherein the threshold density of standard tap cells is based on a corresponding semiconductor process/technology node, e.g., by which will be fabricated a semiconductor device corresponding to a semiconductor device layout diagram which includes layout diagram 200 or the like. In some embodiments, a standard tap cell does not include input/output pins/terminals, e.g., corresponding segments in the first metallization M1 layer. In some embodiments, whereas standard cells such as a buffer cell, a NAND cell, an AND cell, a NOR cell, an OR cell or the like include corresponding one or more pins/terminals in the first metallization M1 layer and are considered to be functional cells, a standard tap cell is regarded as a nonfunctional cell. In some embodiments, a standard tap cell is regarded as a monostate cell. Details of standard tap cells are disclosed, e.g., in U.S. Pat. No. 7,115,460, granted Oct. 3, 2006, U.S. Pat. No. 9,082,886, granted Jul. 14, 2015, and U.S. Pre-Grant Publication No. 20170194319, published Jul. 6, 2017, the entireties of each of which is hereby incorporated by reference.

In some embodiments, one or more of cell-patterns 212AA-212BD represent corresponding standard decoupling-capacitor (DCAP) cells. In some embodiments, a DCAP cell is regarded as a nonfunctional cell. In some embodiments, a standard DCAP cell is regarded as a monostate cell. In some embodiments, one or more of cell-patterns 212AA-212BD represent corresponding standard filler cells.

Figure 3:
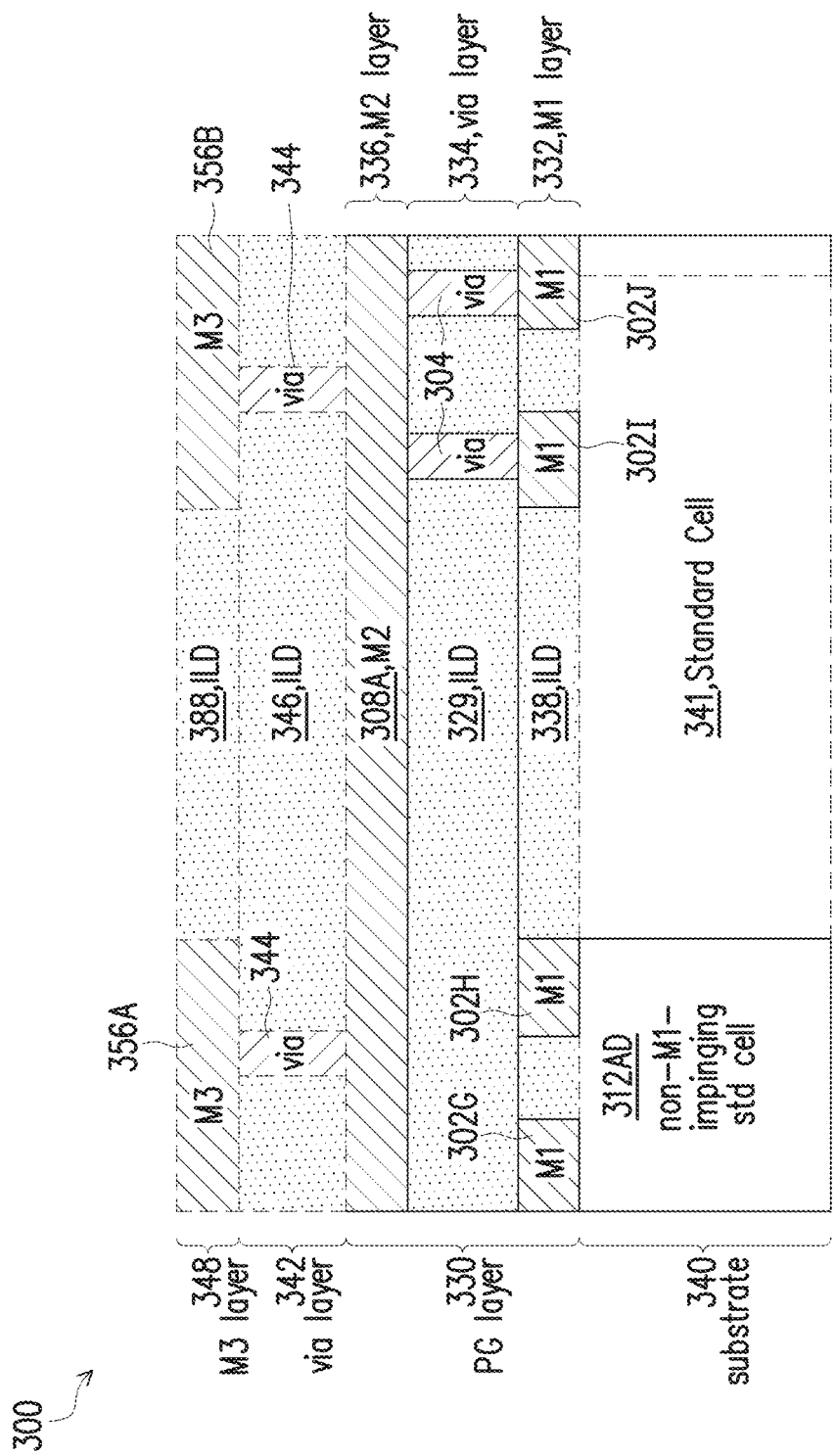
FIG. 3 is a cross-section of power-grid portion of a semiconductor device, in accordance with at least one embodiment of the present disclosure.

FIG. 3 is a cross-section of power-grid portion 300 of a semiconductor device, in accordance with at least one embodiment of the present disclosure. In some embodiments, power-grid portion 300 is produced from layout-diagram 200, such that FIG. 3 corresponds to the line III-III' in FIG. 2. Accordingly, relative to FIG. 2, the numbering of corresponding objects in FIG. 3 is increased by 100. In some embodiments, power-grid portion 300 corresponds to power-grid portion 104 of FIG. 1.

Because power-grid portion 300 is produced from layout-diagram 200, for the sake of brevity, similarities between layout 200 and power-grid portion 300 will not be discussed. Rather, the discussion will focus on differences between power-grid portion 300 and layout-diagram 200.

In FIG. 3, PG layer 330 includes: first metallization layer 332; via layer 334; second metallization layer 336; via layer 342 and third metallization layer 348. Via layer 334 is formed on first metallization layer 332. Second metallization layer 336 is formed on via layer 334. First metallization layer 332 includes conductive first portions 302I and 302J conductive second portions 302G and 302H interspersed with an interlayer-dielectric (ILD) 338. Conductive first portions 302I and 302J provide the power-supply voltage. Conductive second portions 302G and 302H provide the reference voltage. Second metallization layer 336 includes conductive third portion 308A. Via layer 334 includes an ILD 329 interspersed with instances of via 304. The instances of via 304 connect corresponding conductive first portions 302I and 302J to conductive third portion 308A.

Power-grid portion 300 has additional optional layers including a substrate layer 340. Substrate layer 340 includes one or more standard cells 341, where standard cell 341 is different than a non-M1-impinging cell corresponding, e.g., to cell-patterns 212AA-212BD. In cross-section 300, non-M1-impinging cells 312AD and 312AE are formed below first metallization layer 332.

Via layer 342 includes instances of a via 344 interspersed with an ILD 346. Third metallization M3 layer 348 includes conductive fifth conductive portions 356A and 356B interspersed with an ILD 388. Instances of via 344 connect conductive third portion 308A with corresponding fifth conductive portions 356A and 356B of third metallization M3 layer 348.

Figures 4A, 4B:
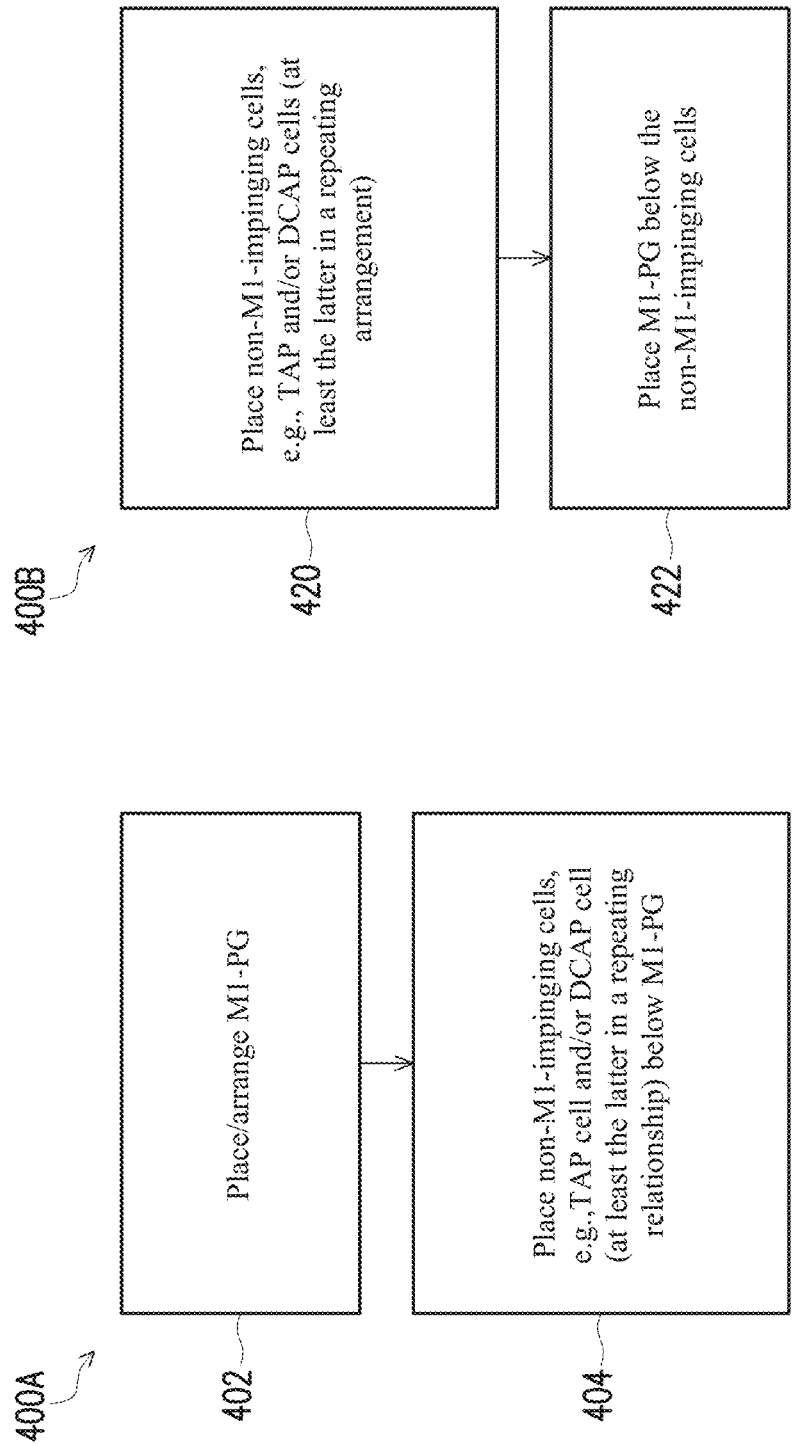
FIG. 4A is a flowchart of a method of forming a layout-diagram of a semiconductor device, in accordance with at least one embodiment of the present disclosure.
FIG. 4B is a flowchart of another method of forming a layout-diagram of a semiconductor device, in accordance with at least one embodiment of the present disclosure.

FIG. 4A is a flowchart of a method 400A of forming a layout-diagram of a semiconductor device, in accordance with at least one embodiment of the present disclosure. Examples of the layout-diagram include one or more of layout-diagrams 200 (FIG. 2), or the like.

In FIG. 4A, the flowchart includes blocks 402-404. At block 402, first conductor-patterns and second conductor-patterns representing corresponding conductive first portions and second portions of the first metallization layer of the power-grid layer are placed/arranged. Examples of the first conductor-patterns and the second conductor-patterns are corresponding first conductor-patterns 202A, 202B, 202E, 202F, 202I and 202J and second conductor-patterns 202C, 202D, 202G, 202H, 202K and 202L of FIGS. 2A-2B. From block 402, flow proceeds to block 404. At block 404, non-M1-impinging cell-patterns are placed below the first conductor-patterns and second conductor-patterns representing corresponding conductive first portions and second portions of the first metallization layer. Examples of the non-M1-impinging cell-patterns include cell-patterns 212AY-212AZ and 212BA-212BD of FIG. 2A and cell-patterns 216AA-216BD of FIG. 2B.

FIG. 4B is a flowchart of a method 400B of forming a layout-diagram of a semiconductor device, in accordance with at least one embodiment of the present disclosure. Examples of the layout-diagram include one or more of layout-diagrams 200 (FIG. 2), or the like.

In FIG. 4B, the flowchart includes blocks 420-422. At block 420, non-M1-impinging cell-patterns are placed in an arrangement. Examples of the non-M1-impinging cell-patterns include cell-patterns 212AY-212AZ and 212BA-212BD of FIG. 2A and cell-patterns 216AA-216BD of FIG. 2B. From block 420, flow proceeds to block 422. At block 422, first conductor-patterns and second conductor-patterns representing corresponding conductive first portions and second portions of the first metallization layer of the power-grid layer are placed/arranged below the arrangement of non-M1-impinging cell-patterns. Examples of the first conductor-patterns and the second conductor-patterns are corresponding first conductor-patterns 202A, 202B, 202E, 202F, 202I and 202J and second conductor-patterns 202C, 202D, 202G, 202H, 202K and 202L of FIG. 2.

Figure 5A:
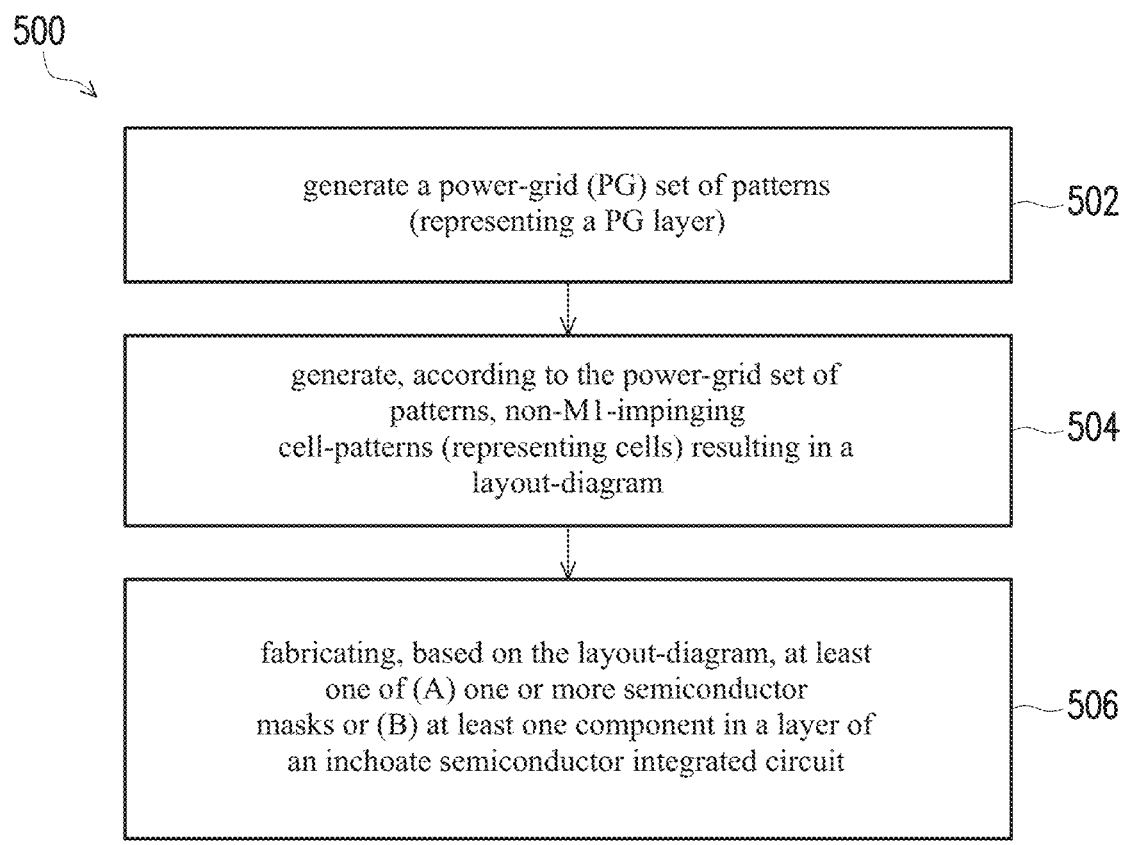
FIG. 5A is a flowchart of yet another method of forming another layout-diagram of a semiconductor device, in accordance with at least one embodiment of the present disclosure.

FIG. 5A is a flowchart of a method 500 of forming a layout-diagram of a semiconductor device, in accordance with at least one embodiment of the present disclosure. Examples of the layout-diagram include one or more of layout-diagrams 200 (FIG. 2), or the like.

In FIG. 5A, the flowchart includes blocks 502-506. At block 502, a power-grid (PG) set of patterns is generated which represent a PG layer. An example of the PG set of patterns is the PG set of patterns of FIG. 2 which includes: first conductor-patterns 202A, 202B, 202E, 202F, 202I and 202J; via patterns 204; and second conductor-patterns 202C, 202D, 202G, 202H, 202K and 202L. From block 502, flow proceeds to block 504. At block 504, non-M1-impinging cell-patterns are generated according to the PG set of patterns, resulting in a layout-diagram. Examples of the non-M1-impinging cell-patterns include cell-patterns 212AY-212AZ and 212BA-212BD of FIG. 2 and cell-patterns 216AA-216BD of FIG. 2B. From block 504, flow proceeds to block 506. At block 506, based on the layout, at least one of (A) one or more semiconductor masks is fabricated (see FIG. 8, discussed below) or (B) at least one component in a layer of an inchoate semiconductor integrated circuit is fabricated (again, see FIG. 8, discussed below).

Figure 5B:
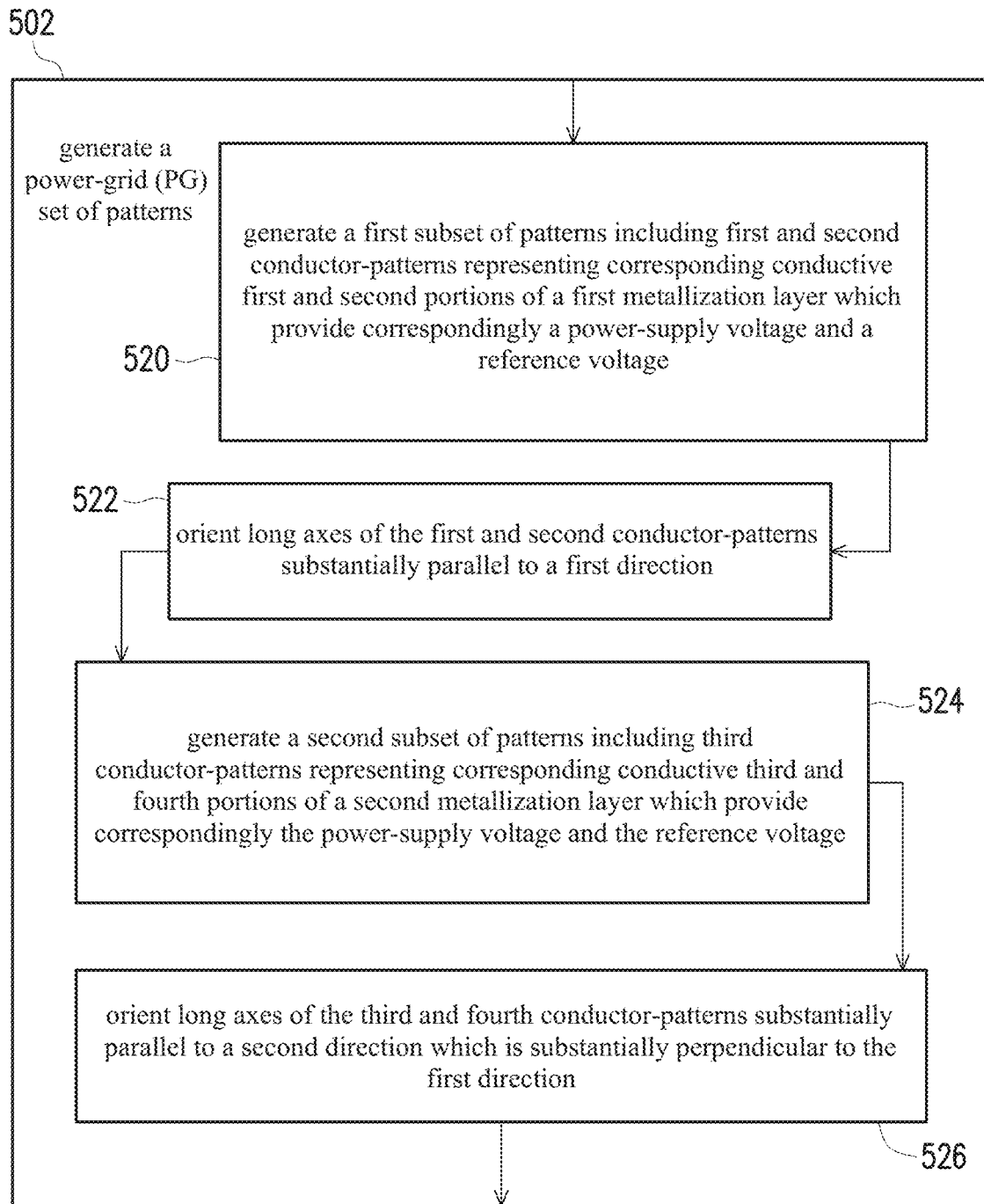
FIG. 5B is a flowchart showing a block of the flowchart of FIG. 5A in more detail, in accordance with at least one embodiment of the present disclosure.

FIG. 5B is a flowchart showing block 502 of the flowchart of FIG. 5A in more detail, in accordance with at least one embodiment of the present disclosure.

In FIG. 5B, block 502 (again, which generates a PG set of patterns) includes blocks 520-526. At block 520, a first subset of patterns is generated including first and second conductor-patterns representing corresponding conductive first and second portions of a first metallization layer which provide correspondingly a power-supply voltage and a reference voltage. Examples of the first and second conductor-patterns includes first conductor-patterns 202A, 202B, 202E, 202F, 202I and 202J and second conductor-patterns 202C, 202D, 202G, 202H, 202K and 202L. From block 520, flow proceeds to block 522. At block 522, long axes of the first and second conductor-patterns are oriented substantially parallel to the first direction. From block 522, flow proceeds to block 524. At block 524, a second subset of patterns is generated including third and fourth conductor-patterns representing corresponding conductive third and fourth portions of a second metallization layer which provide correspondingly the power-supply voltage and the reference voltage. Examples of the third and fourth conductor-patterns include third conductor-patterns 208A, 208C, 208E, 208G and 208I and fourth conductor-patterns 208B, 208D, 208F and 208H of FIG. 2. From block 524, flow proceeds to block 526. At block 526, long axes of the third and fourth conductor-patterns are oriented substantially parallel to the second direction.

Figure 5C:
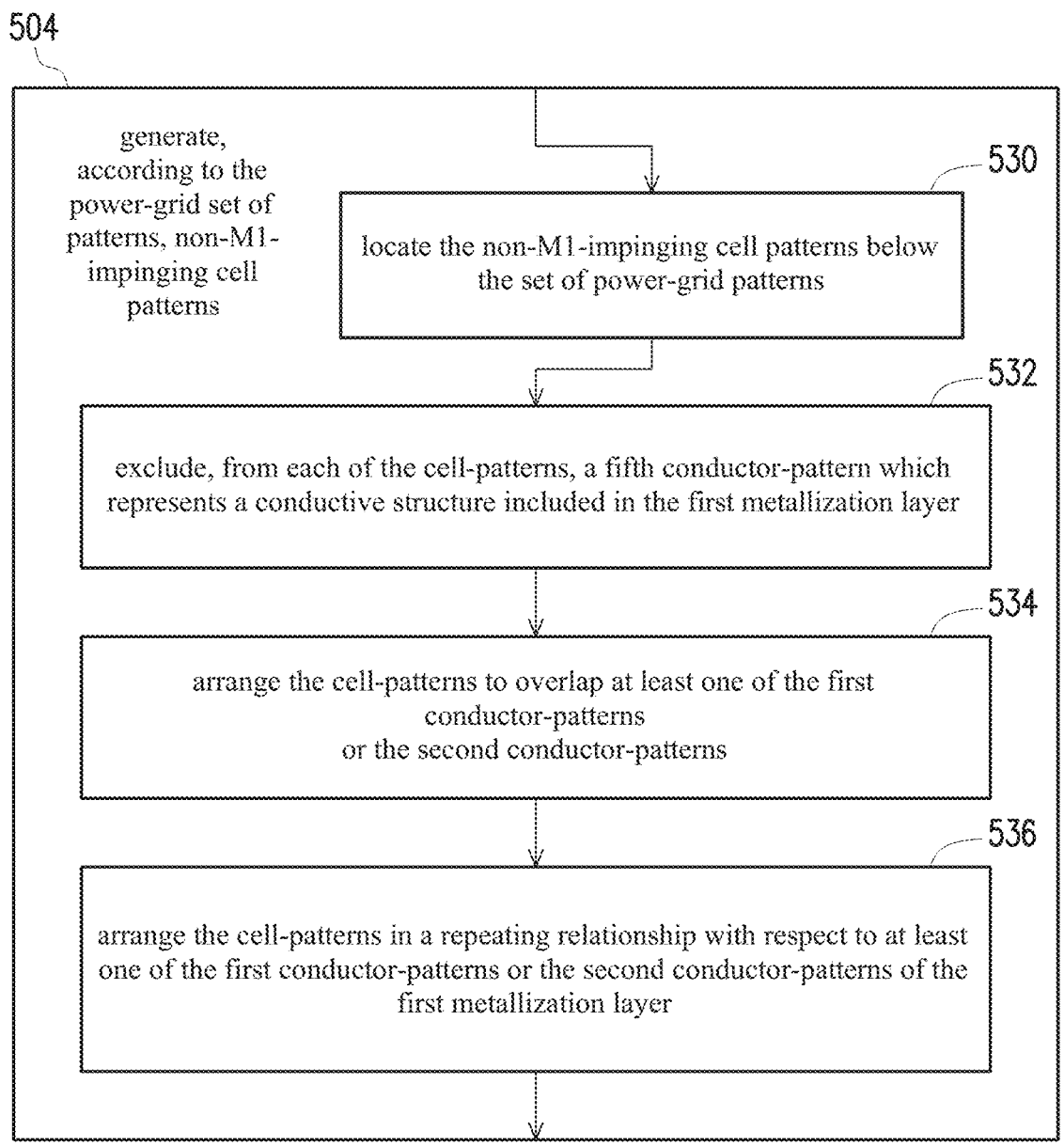
FIG. 5C is a flowchart showing another block of the flowchart of FIG. 5A in more detail, in accordance with at least one embodiment of the present disclosure.

FIG. 5C is a flowchart showing block 504 of the flowchart of FIG. 5A in more detail, in accordance with at least one embodiment of the present disclosure.

In FIG. 5C, block 502 (again, which generates non-M1-impinging cell-patterns according to the PG set of patterns) includes blocks 530-536. At block 530, the non-M1-impinging cell-patterns are located below the set of PG patterns. An example of locating the non-M1-impinging cell-patterns below the set of PG patterns is layout diagram 200 of FIG. 2. From block 530, flow proceeds to a block 532. At block 532, a fifth conductor-pattern is excluded from each of the cell-patterns. The fifth conductor-pattern represents a conductive structure included in the first metallization layer. Examples of the exclusion of the fifth conductor-pattern from the cell-patterns is reflected in cell-patterns 212AY-212AZ of FIG. 2 being located below, but not extending into, first metallization layer 332. From block 532, flow proceeds to block 534.

At block 534, the cell-patterns are arranged to overlap at least one of the first conductor-patterns or the second conductor-patterns. Examples, in the context of FIG. 2, of the overlap is that cell-patterns 212AY-212AZ overlap corresponding segments of first conductor-patterns 202A, 202B, 202E, 202F, 202I and 202J and second conductor-patterns 202C, 202D, 202G, 202H, 202K and 202L. Examples, in the context of FIG. 2B, of the overlap is that cell-patterns 216AY-216AZ overlap corresponding segments of first conductor-patterns 202A, 202B, 202E, 202F, 202I and 202J and second conductor-patterns 202C, 202D, 202G, 202H, 202K and 202L. From block 534, flow proceeds to block 536.

At block 536, the cell-patterns are arranged in a repeating relationship with respect to at least one of the first conductor-patterns or the second conductor-patterns of the first metallization layer. Examples of the repeating relationship are discussed above in the context of FIG. 2.

Figure 6A:
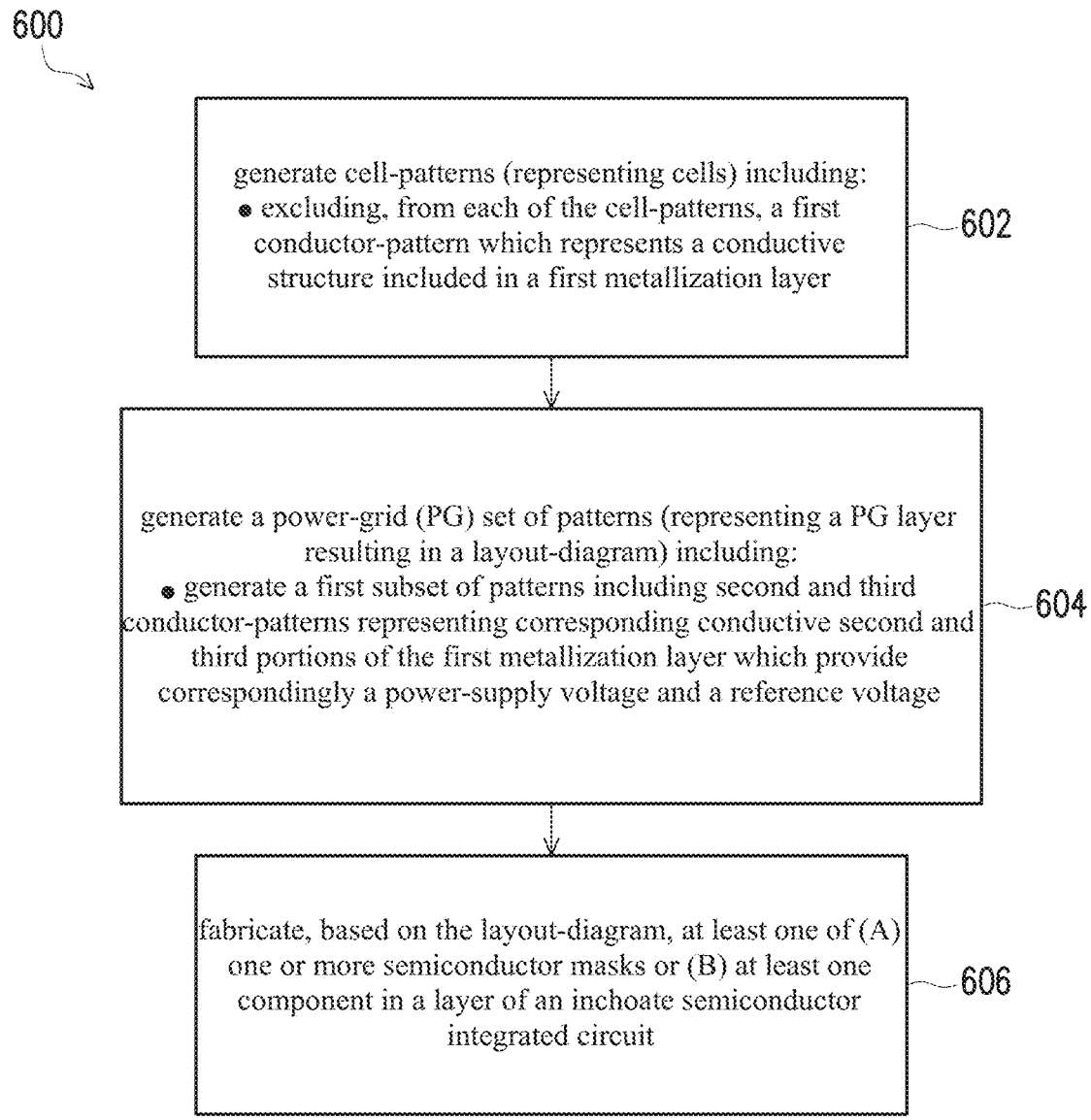
FIG. 6A is a flowchart of still another method of forming another layout-diagram of a semiconductor device, in accordance with at least one embodiment of the present disclosure.

FIG. 6A is a flowchart of a method 600 of forming a layout-diagram of a semiconductor device, in accordance with at least one embodiment of the present disclosure. Examples of the layout-diagram include one or more of layout-diagrams 200 (FIG. 2), or the like.

In FIG. 6A, the flowchart includes blocks 602-606. At block 602, cell-patterns are generated from which are excluded, for each of the cell-patterns, a first conductor-pattern which represents a conductive structure included in the first metallization layer, resulting in non-M1-impinging cell-patterns. Examples of the exclusion of the first conductor-pattern from the cell-patterns is reflected in cell-patterns 212AY-212AZ of FIG. 2 being located below, but not extending into, first metallization layer 332. From block 602, flow proceeds to block 604.

At block 604, a power-grid (PG) set of patterns is generated which represent a PG layer. Generating the of PG patterns includes generating a first subset of patterns including second and third conductor-patterns, resulting in a layout-diagram. The second and third conductor-patterns represent corresponding conductive second and third portions of a first metallization layer which provide correspondingly a power-supply voltage and a reference voltage. Examples of the second and third conductor-patterns includes first conductor-patterns 202A, 202B, 202E, 202F, 202I and 202J and second conductor-patterns 202C, 202D, 202G, 202H, 202K and 202L. From block 604, flow proceeds to block 606. At block 606, based on the layout, at least one of (A) one or more semiconductor masks is fabricated (see FIG. 8, discussed below) or (B) at least one component in a layer of an inchoate semiconductor integrated circuit is fabricated (again, see FIG. 8, discussed below).

Figure 6B:
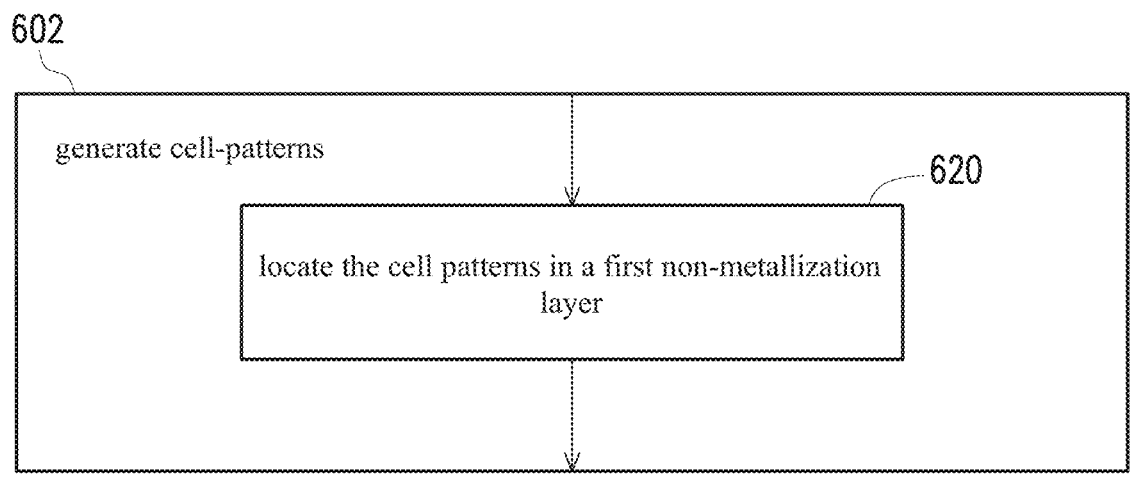
FIG. 6B is a flowchart showing a block of the flowchart of FIG. 6A in more detail, in accordance with at least one embodiment of the present disclosure.

FIG. 6B is a flowchart showing block 602 of the flowchart of FIG. 6A in more detail, in accordance with at least one embodiment of the present disclosure.

In FIG. 6B, block 602 (again, which generates non-M1-impinging cell-patterns according to the PG set of patterns) include block 620. At block 620, the cell-patterns are located in a non-metallization layer.

Examples of locating the non-M1-impinging cell-patterns in a non-metallization layer are locating the non-M1-impinging cell-patterns below (as in FIG. 2) the first conductor-patterns 202A, 202B, 202E, 202F, 202I and 202J and second conductor-patterns 202C, 202D, 202G, 202H, 202K and 202L which represent conductive first and second portions of first metallization layer 332.

Figure 6C:
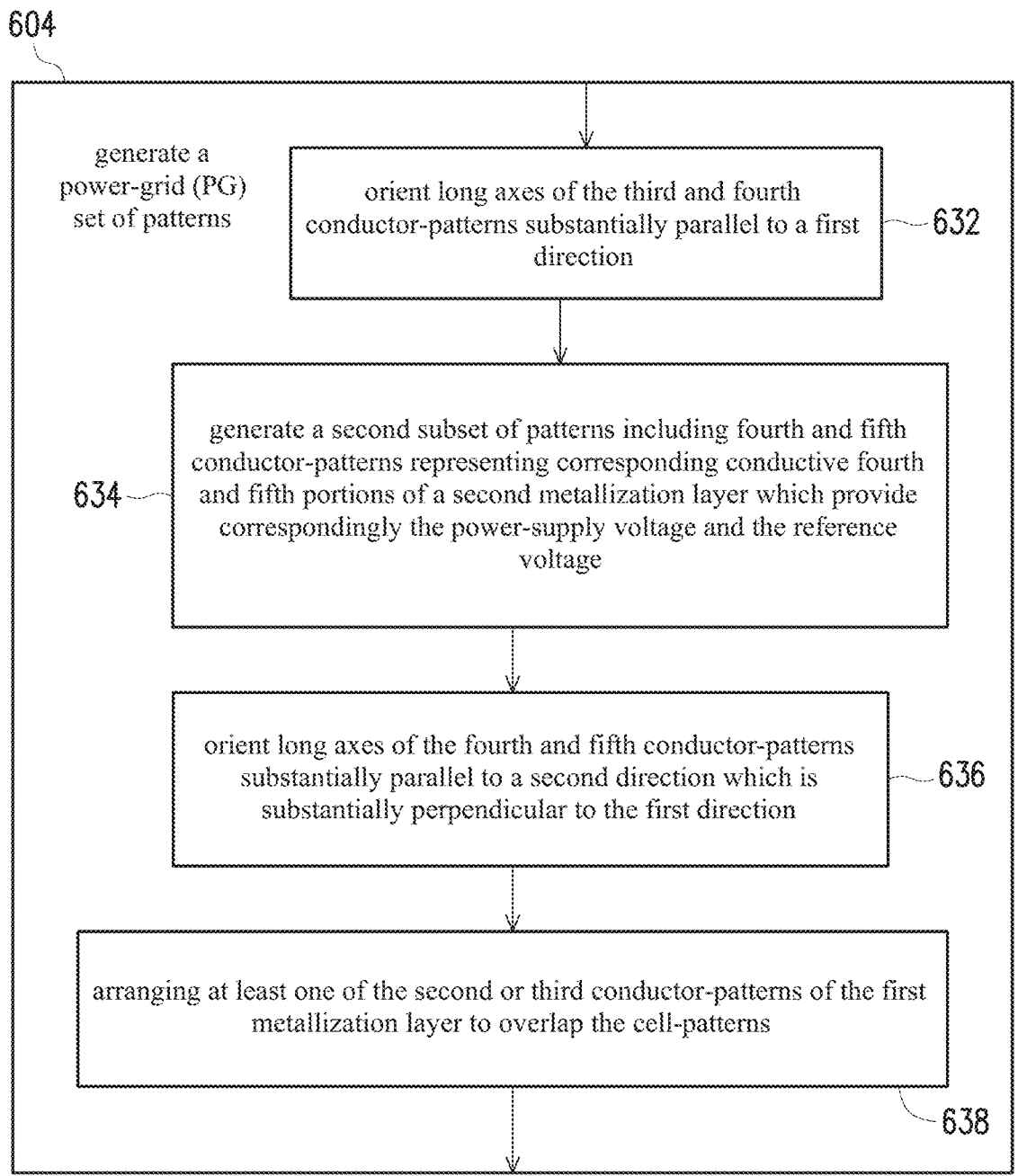
FIG. 6C is a flowchart showing another block of the flowchart of FIG. 6A in more detail, in accordance with at least one embodiment of the present disclosure.

FIG. 6C is a flowchart showing block 604 of the flowchart of FIG. 6A in more detail, in accordance with at least one embodiment of the present disclosure.

In FIG. 6C, block 604 (again, which generates a PG set of patterns) includes blocks 632-638. At block 632, long axes of the second and third conductor-patterns are oriented substantially parallel to the first direction. From block 632, flow proceeds to block 634. At block 634, a second subset of patterns is generated including fourth and fifth conductor-patterns representing corresponding conductive fourth and fifth portions of a second metallization layer which provide correspondingly the power-supply voltage and the reference voltage. Examples of the fourth and fifth conductor-patterns include third conductor-patterns 208A, 208C, 208E, 208G and 208I and fourth conductor-patterns 208B, 208D, 208F and 208H of FIG. 2. From block 634, flow proceeds to block 636. At block 636, long axes of the fourth and fifth conductor-patterns are oriented substantially parallel to the second direction. From block 636, flow proceeds to a block 638.

At block 634, at least one of the second conductor-patterns or the third conductor-patterns are arranged to overlap the non-M1-impinging cell-patterns. Examples, in the context of FIG. 2, of the overlap is that cell-patterns 212AY-212AZ overlap corresponding segments of first conductor-patterns 202A, 202B, 202E, 202F, 202I and 202J and second conductor-patterns 202C, 202D, 202G, 202H, 202K and 202L. Examples, in the context of FIG. 2B, of the overlap is that cell-patterns 216AY-216AZ overlap corresponding segments of first conductor-patterns 202A, 202B, 202E, 202F, 202I and 202J and second conductor-patterns 202C, 202D, 202G, 202H, 202K and 202L. From block 634, flow proceeds to block 636.

Figure 7:
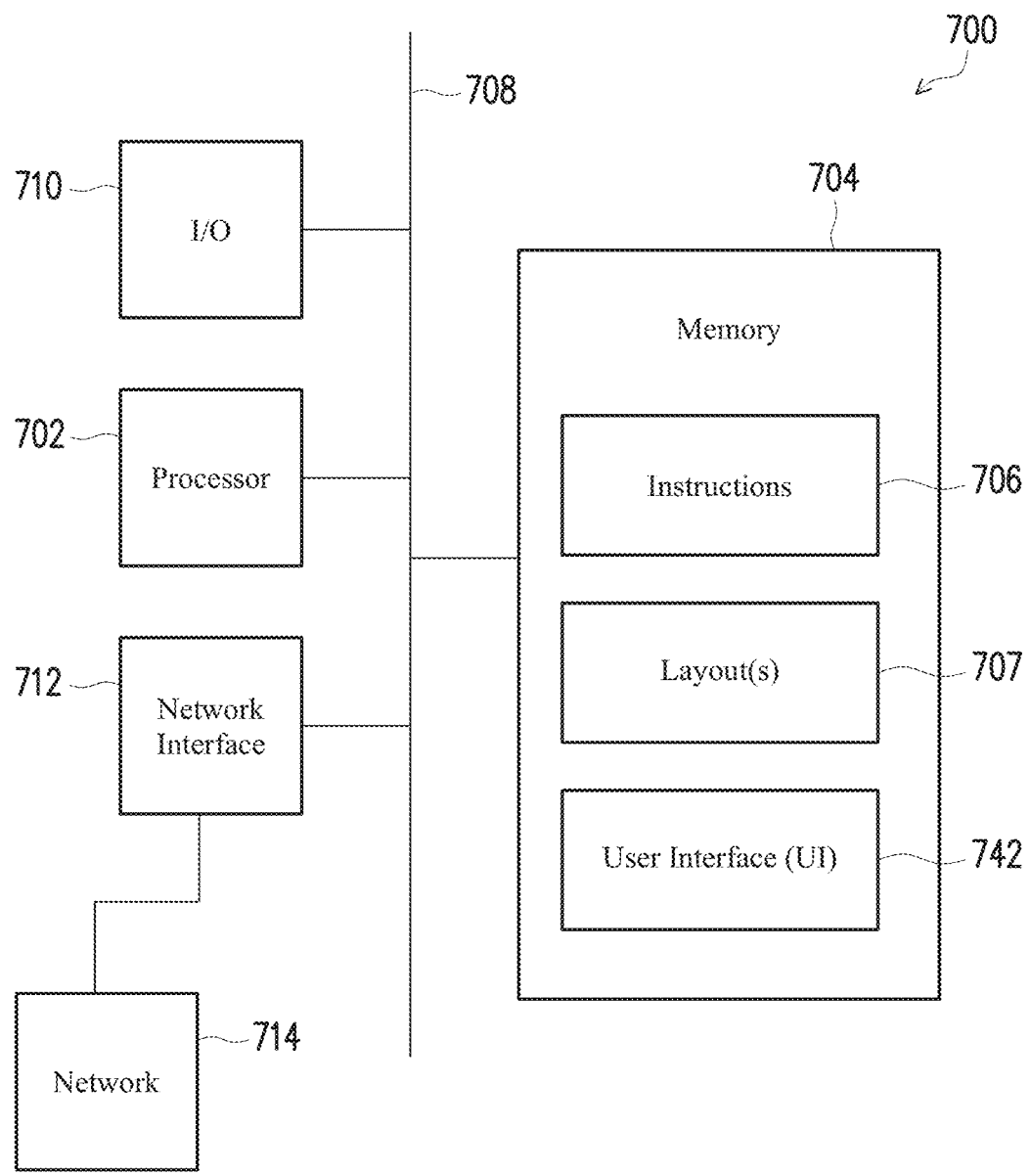
FIG. 7 is a block diagram of an electronic design automation (EDA) system, in accordance with at least one embodiment of the present disclosure.

FIG. 7 is a block diagram of an electronic design automation (EDA) system 700, in accordance with at least one embodiment of the present disclosure.

In some embodiments, EDA system 700 includes an APR system. The methods of flowcharts of FIGS. 5A-5C and/or FIGS. 6A-6C (hereinafter, the noted processes and/or methods) are implemented, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of, e.g., the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. Computer-readable storage medium 704 also includes one or more layouts 707 generated according to a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause system 700 (where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 stores a library (not shown) of standard cells.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

Again, EDA system 700 includes network interface 712. Network interface 712 includes wireless network interfaces such as BLUETOOTH, WIFI, WIMAX, GPRS, WCDMA, or the like; or wired network interfaces such as ETHERNET, USB, or the like. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
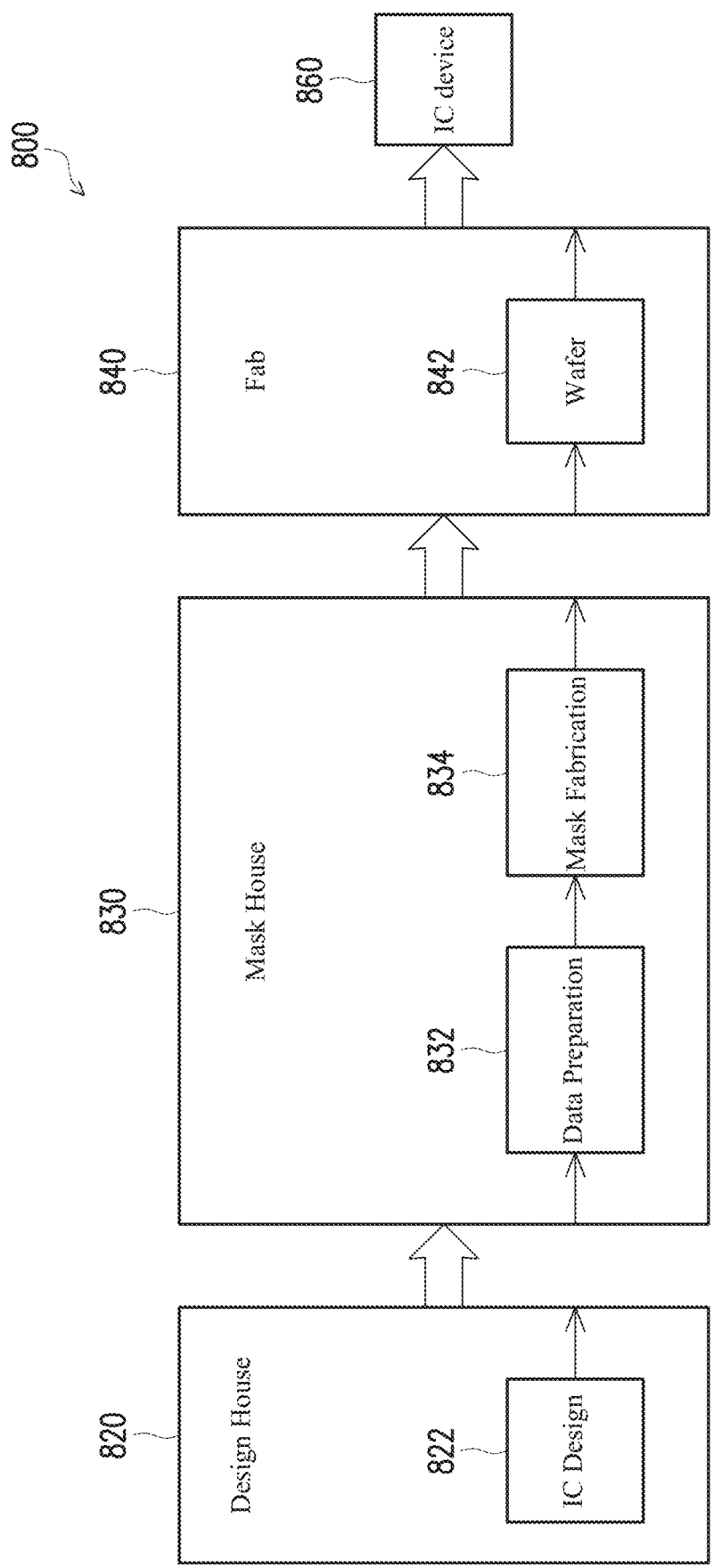
FIG. 8 is a block diagram of an integrated circuit (IC) manufacturing system, and an IC manufacturing flow associated therewith, in accordance with at least one embodiment of the present disclosure.

FIG. 8 is a block diagram of an integrated circuit (IC) manufacturing system 800, and an IC manufacturing flow associated therewith, in accordance with at least one embodiment of the present disclosure.

In FIG. 8, IC manufacturing system 800 includes entities, such as a design house 820, a mask house 840, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 840, and IC fab 850 is owned by a single larger company. In some embodiments, two or more of design house 820, mask house 840, and IC fab 850 coexist in a common facility and use common resources.

Design house (or design team) 820 generates an IC design layout 822. IC design layout 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout 822 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout 822. The design procedure includes one or more of logic design, physical design or place and route. IC design layout 822 is presented in one or more data files having information of the geometrical patterns. For example, IC design layout 822 can be expressed in a GDSII file format or DFII file format.

Mask house 840 includes data preparation 842 and mask fabrication 844. Mask house 840 uses IC design layout 822 to manufacture one or more masks to be used for fabricating the various layers of IC device 860 according to IC design layout 822. Mask house 840 performs mask data preparation 842, where IC design layout 822 is translated into a representative data file ("RDF"). Mask data preparation 842 provides the RDF to mask fabrication 844. Mask fabrication 844 includes a mask writer. A mask writer converts the RDF to an image on a substrate, such as a mask (reticle) or a semiconductor wafer. The design layout is manipulated by mask data preparation 842 to comply with particular characteristics of the mask writer and/or requirements of IC fab 850. In FIG. 8, mask data preparation 842 and mask fabrication 844 are illustrated as separate elements. In some embodiments, mask data preparation 842 and mask fabrication 844 can be collectively referred to as mask data preparation.

In some embodiments, mask data preparation 842 includes optical proximity correction (OPC) which uses lithography enhancement techniques to compensate for image errors, such as those that can arise from diffraction, interference, other process effects and the like. OPC adjusts IC design layout 822. In some embodiments, mask data preparation 842 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 842 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 844, which may undo part of the modifications performed by OPC in order to meet mask creation rules.

In some embodiments, mask data preparation 842 includes lithography process checking (LPC) that simulates processing that will be implemented by IC fab 850 to fabricate IC device 860. LPC simulates this processing based on IC design layout 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 822.

It should be understood that the above description of mask data preparation 842 has been simplified for the purposes of clarity. In some embodiments, data preparation 842 includes additional features such as a logic operation (LOP) to modify the IC design layout according to manufacturing rules. Additionally, the processes applied to IC design layout 822 during data preparation 842 may be executed in a variety of different orders.

After mask data preparation 842 and during mask fabrication 844, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions, and is used to make one or more lithographic exposures. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in the semiconductor wafer, in an etching process to form various etching regions in the semiconductor wafer, and/or in other suitable processes.

IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses the mask (or masks) fabricated by mask house 840 to fabricate IC device 860. Thus, IC fab 850 at least indirectly uses IC design layout 822 to fabricate IC device 860. In some embodiments, a semiconductor wafer 852 is fabricated by IC fab 850 using the mask (or masks) to form IC device 860. Semiconductor wafer 852 includes a silicon substrate or other proper substrate having material layers formed thereon. Semiconductor wafer 852 further includes one or more of various doped regions, dielectric features, multilevel interconnects, and the like (formed at subsequent manufacturing steps).

Details regarding an integrated circuit (IC) manufacturing system (e.g., system 1000 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In one embodiment, a semiconductor structure includes: a power-grid (PG) layer including: a first metallization layer including: first portions and second portions which: are conductive; are configured to provide correspondingly a power-supply voltage and a reference voltage; and have corresponding long axes oriented substantially parallel to a first direction; and corresponding ones of the first portions of the first metallization layer being arranged in first pairs; corresponding ones of the second portions of the first metallization layer being arranged in second pairs; a second metallization layer over the first metallization layer, the second metallization layer including: third portions and fourth portions which: are conductive; are configured to provide correspondingly the power-supply voltage and the reference voltage; and have corresponding long axes oriented substantially parallel to a second direction substantially perpendicular to the first direction; and a set of cells, wherein the set of cells is located below the PG layer; each cell is a monostate cell which lacks an input signal and has a single output state; the cells being arranged to overlap at least one of the first and second portions of the first metallization layer relative to the first direction; and the cells being arranged in a repeating relationship that each cell overlaps, relative to the first direction and the second direction, an intersection of (A) a corresponding one of the first or second pairs with (B) at least a corresponding one of the third portions or a corresponding one of the fourth portions.

In some embodiments, the cells include tap cells. In some embodiments, the cells further include decoupling capacitor (DCAP) cells. In some embodiments, the cells further include filler cells. In some embodiments, according to the repeating relationship of the cells, centers of the cells are arranged to be substantially aligned with centers of the corresponding first or second pairs. In some embodiments, corresponding ones of the third and fourth portions of the second metallization layer are arranged in third pairs; and according to the repeating relationship of the cells, each cell is arranged to overlap an intersection of (A) the corresponding one of the first or second pairs with (B) a corresponding one of the third pairs. In some embodiments, according to the repeating relationship of the cells, each cell is arranged symmetrically with respect to the intersection of (A) the corresponding one of the first or second pairs with (B) a corresponding one of the third pairs.

In yet another embodiment, a semiconductor structure includes: a power-grid (PG) layer including: a first metallization layer including: first portions and second portions which: are conductive; are configured to provide correspondingly a power-supply voltage and a reference voltage; and have corresponding long axes oriented substantially parallel to a first direction; and corresponding ones of the first portions of the first metallization layer being arranged in first pairs; corresponding ones of the second portions of the first metallization layer being arranged in second pairs; a second metallization layer over the first metallization layer, the second metallization layer including: third portions and fourth portions which: are conductive; are configured to provide correspondingly the power-supply voltage and the reference voltage; and have corresponding long axes oriented substantially parallel to a second direction substantially perpendicular to the first direction; and a set of cells, wherein the set of cells is located below the PG layer; each cell is a monostate cell which lacks an input signal and has a single output state; the cells being arranged to overlap at least one of the first and second portions of the first metallization layer relative to the first direction; and the cells being arranged in a repeating relationship that each cell symmetrically overlaps, relative to the first direction and the second direction, an intersection of (A) a corresponding one of the first or second pairs with (B) at least a corresponding one of the third portions or a corresponding one of the fourth portions. In some embodiments, the cells include tap cells. In some embodiments, the cells further include decoupling capacitor (DCAP) cells. In some embodiments, the cells further include: filler cells. In some embodiments, according to the repeating relationship of the cells, centers of the cells are arranged to be substantially aligned with centers of the corresponding first or second pairs. In some embodiments, corresponding ones of the third and fourth portions of the second metallization layer are arranged in third pairs; and according to the repeating relationship of the cells, each cell is arranged to overlap an intersection of (A) the corresponding one of the first or second pairs with (B) a corresponding one of the third pairs. In some embodiments, according to the repeating relationship of the cells, each cell is arranged symmetrically with respect to the intersection of (A) the corresponding one of the first or second pairs with (B) a corresponding one of the third pairs.

In yet another embodiment, a semiconductor structure includes: a power-grid (PG) layer including: first portions which: are conductive; are configured to provide a power-supply voltage and a reference voltage; and have corresponding long axes oriented substantially parallel to a first direction; and corresponding ones of the first portions being arranged in first pairs; a metallization layer over the PG layer, the metallization layer including second portions which: are conductive; are configured to provide the power-supply voltage and the reference voltage; and have corresponding long axes oriented substantially parallel to a second direction substantially perpendicular to the first direction; and a set of cells, wherein the set of cells is located below the PG layer; each cell is a monostate cell which lacks an input signal and has a single output state; the cells being arranged to overlap at least one of the first portions of the first metallization layer relative to the first direction; and the cells being arranged in a repeating relationship that each cell symmetrically overlaps, relative to the first direction and the second direction, an intersection of (A) a corresponding one of the first pairs with (B) a corresponding one of the second portions. In some embodiments, the cells include tap cells. In some embodiments, the cells further include: decoupling capacitor (DCAP) cells. In some embodiments, wherein the cells further include filler cells. In some embodiments, according to the repeating relationship of the cells, centers of the cells are arranged to be substantially aligned with centers of the corresponding first pairs. In some embodiments, corresponding ones of the second portions of the metallization layer are arranged in second pairs; and according to the repeating relationship of the cells, each cell is arranged to overlap an intersection of (A) the corresponding one of the first pairs with (B) a corresponding one of the second pairs.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor structure comprising:
   a power-grid (PG) layer including:
      a first metallization layer including:
         first portions and second portions which: are conductive; are configured to provide correspondingly a power-supply voltage and a reference voltage; and have corresponding long axes oriented substantially parallel to a first direction; and
         corresponding ones of the first portions of the first metallization layer being arranged in first pairs;
         corresponding ones of the second portions of the first metallization layer being arranged in second pairs;
      a second metallization layer over the first metallization layer, the second metallization layer including:
         third portions and fourth portions which: are conductive; are configured to provide correspondingly the power-supply voltage and the reference voltage; and have corresponding long axes oriented substantially parallel to a second direction substantially perpendicular to the first direction; and
   a set of cells, wherein the set of cells is located below the PG layer;
      each cell is a monostate cell which lacks an input signal and has a single output state;
      the cells being arranged to overlap at least one of the first and second portions of the first metallization layer relative to the first direction; and
      the cells being arranged in a repeating relationship that each cell overlaps, relative to the first direction and the second direction, an intersection of (A) a corresponding one of the first or second pairs with (B) at least a corresponding one of the third portions or a corresponding one of the fourth portions.

2. The semiconductor structure of claim 1, wherein:
   the cells include tap cells.

3. The semiconductor structure of claim 1, wherein the cells further include:
   decoupling capacitor (DCAP) cells.

4. The semiconductor structure of claim 1, wherein the cells further include:
   filler cells.

5. The semiconductor structure of claim 1, wherein:
   according to the repeating relationship of the cells, centers of the cells are arranged to be substantially aligned with centers of the corresponding first or second pairs.

6. The semiconductor structure of claim 1, wherein:
   corresponding ones of the third and fourth portions of the second metallization layer are arranged in third pairs; and
   according to the repeating relationship of the cells, each cell is arranged to overlap an intersection of (A) the corresponding one of the first or second pairs with (B) a corresponding one of the third pairs.

7. The semiconductor structure of claim 6, wherein:
   according to the repeating relationship of the cells, each cell is arranged symmetrically with respect to the intersection of (A) the corresponding one of the first or second pairs with (B) a corresponding one of the third pairs.

8. A semiconductor structure comprising:
   a power-grid (PG) layer including:
      a first metallization layer including:
         first portions and second portions which: are conductive; are configured to provide correspondingly a power-supply voltage and a reference voltage; and have corresponding long axes oriented substantially parallel to a first direction; and
         corresponding ones of the first portions of the first metallization layer being arranged in first pairs;
         corresponding ones of the second portions of the first metallization layer being arranged in second pairs;
      a second metallization layer over the first metallization layer, the second metallization layer including:
         third portions and fourth portions which: are conductive; are configured to provide correspondingly the power-supply voltage and the reference voltage; and
      have corresponding long axes oriented substantially parallel to a second direction substantially perpendicular to the first direction; and
   a set of cells, wherein the set of cells is located below the PG layer;
      each cell is a monostate cell which lacks an input signal and has a single output state;
      the cells being arranged to overlap at least one of the first and second portions of the first metallization layer relative to the first direction; and
      the cells being arranged in a repeating relationship that each cell symmetrically overlaps, relative to the first direction and the second direction, an intersection of (A) a corresponding one of the first or second pairs with (B) at least a corresponding one of the third portions or a corresponding one of the fourth portions.

9. The semiconductor structure of claim 8, wherein:
   the cells include tap cells.

10. The semiconductor structure of claim 8, wherein the cells further include:
    decoupling capacitor (DCAP) cells.

11. The semiconductor structure of claim 8, wherein the cells further include:
    filler cells.

12. The semiconductor structure of claim 8, wherein:
    according to the repeating relationship of the cells, centers of the cells are arranged to be substantially aligned with centers of the corresponding first or second pairs.

13. The semiconductor structure of claim 8, wherein:
    corresponding ones of the third and fourth portions of the second metallization layer are arranged in third pairs; and
    according to the repeating relationship of the cells, each cell is arranged to overlap an intersection of (A) the corresponding one of the first or second pairs with (B) a corresponding one of the third pairs.

14. The semiconductor structure of claim 13, wherein:
    according to the repeating relationship of the cells, each cell is arranged symmetrically with respect to the intersection of (A) the corresponding one of the first or second pairs with (B) a corresponding one of the third pairs.

15. A semiconductor structure comprising:
    a power-grid (PG) layer including:
        first portions which: are conductive; are configured to provide a power-supply voltage and a reference voltage; and have corresponding long axes oriented substantially parallel to a first direction; and
        corresponding ones of the first portions being arranged in first pairs;
    a metallization layer over the PG layer, the metallization layer including second portions which: are conductive; are configured to provide the power-supply voltage and the reference voltage; and have corresponding long axes oriented substantially parallel to a second direction substantially perpendicular to the first direction; and
    a set of cells, wherein the set of cells is located below the PG layer;
        each cell is a monostate cell which lacks an input signal and has a single output state;
        the cells being arranged to overlap at least one of the first portions of the PG layer relative to the first direction; and
        the cells being arranged in a repeating relationship that each cell symmetrically overlaps, relative to the first direction and the second direction, an intersection of (A) a corresponding one of the first pairs with (B) a corresponding one of the second portions.

16. The semiconductor structure of claim 15, wherein the cells include tap cells.

17. The semiconductor structure of claim 15, wherein the cells further include: decoupling capacitor (DCAP) cells.

18. The semiconductor structure of claim 15, wherein the cells further include filler cells.

19. The semiconductor structure of claim 15, wherein according to the repeating relationship of the cells, centers of the cells are arranged to be substantially aligned with centers of the corresponding one of the first pairs.

20. The semiconductor structure of claim 15, wherein:
    corresponding ones of the second portions of the metallization layer are arranged in second pairs; and
    according to the repeating relationship of the cells, each cell is arranged to overlap an intersection of (A) the corresponding one of the first pairs with (B) the corresponding one of the second pairs.

* * * * *